United States Patent [19]

Sees et al.

[11] Patent Number: 6,019,806
[45] Date of Patent: Feb. 1, 2000

[54] HIGH SELECTIVITY SLURRY FOR SHALLOW TRENCH ISOLATION PROCESSING

[76] Inventors: Jennifer A. Sees, 4189 Fryer St., The Colony, Tex. 75056; Lindsey H. Hall, 10731 Clearbrook, Dallas, Tex. 75218; Jagdish Prasad, 2628 Bauer Dr., Denton, Tex. 75207; Ashutosh Misra, 2220 W. Hickory, Apt. #204, Denton, Tex. 76201

[21] Appl. No.: 09/004,358

[22] Filed: Jan. 8, 1998

[51] Int. Cl.[7] ........................................................ B24B 1/00
[52] U.S. Cl. ................................ 51/308; 252/79.5; 106/3; 438/693; 51/309
[58] Field of Search ............................... 252/79.5; 106/3; 51/308, 309; 438/693

[56] References Cited

U.S. PATENT DOCUMENTS

| | | | |
|---|---|---|---|
| 4,549,374 | 10/1985 | Basi et al. ................................... | 106/3 |
| 4,874,463 | 10/1989 | Kose et al. ............................... | 252/79.5 |
| 5,571,373 | 11/1996 | Krishna et al. .......................... | 438/693 |
| 5,626,715 | 5/1997 | Rostoker ................................. | 438/693 |

FOREIGN PATENT DOCUMENTS

| | | |
|---|---|---|
| 0 103 085 | 3/1984 | European Pat. Off. . |
| 105 464 | 4/1974 | Germany . |

OTHER PUBLICATIONS

B. Holley, "Semiconductor Polishing Composition," *IBM Technical Disclosure Bulletin*, vol. 23, No. 7A, 1980, p. 2750 (no month).

*Primary Examiner*—Michael Marcheschi

[57] ABSTRACT

This invention is for an improved slurry for shallow trench isolation processing in chemical mechanical polishing of semiconductor devices. The oxide/nitride selectivity is enhanced by increasing the pH of the slurry, increasing the solids content of the slurry and/or by adding a fluoride salt to the slurry. With these modifications, selectivity of greater than 10:1 can be attained.

36 Claims, No Drawings

HIGH SELECTIVITY SLURRY FOR SHALLOW TRENCH ISOLATION PROCESSING

TECHNICAL FIELD OF THE INVENTION

The present invention relates to an improved slurry for shallow trench isolation processing in chemical mechanical polishing of semiconductor devices. The present invention also relates to methods for enhancing the oxide/nitride selectivity in such processes by increasing the pH of the slurry and/or by contacting the slurry with a fluoride salt.

BACKGROUND OF THE INVENTION

A variety of isolation structures are presently used to fabricate semiconductor circuits. In one popular approach, shallow isolation structures are used to isolate adjacent electronic devices.

Shallow isolation structures may be fashioned using the LOCal Oxidation of Silicon (LOCOS) isolation approach. In the LOCOS process, a pad-oxide ($SiO_2$) layer is first grown on the surface of a semiconductor substrate, followed by deposition of a silicon nitride ($Si_3N_4$) layer over the pad-oxide layer. Using well-known techniques, these layers are patterned to define the width of the shallow recess to be etched into the substrate. Once the shallow recess has been etched, the substrate is subjected to an oxidation process whereby silicon dioxide ($SiO_2$) is grown in the recess. The silicon nitride layer (which has not yet been removed) prevents any oxide growth over the substrate's surface. As a result, oxide grows to fill the entire recess, including the opening in the patterned oxide and silicon nitride layers which defined the width of the shallow recess.

Devices for preparing semiconductor wafers are known in the art. Wafer preparation includes slicing semiconductor crystals into thin sheets, and polishing the sliced wafers to free them of surface irregularities. In general, the polishing process is accomplished in at least two steps. The first step is rough polishing or abrasion. This step may be performed by an abrasive slurry lapping process in which a wafer mounted on a rotating carrier is brought into contact with a rotating polishing pad upon which is sprayed a slurry of insoluble abrasive particles suspended in a liquid. Material is removed from the wafer by the mechanical buffing action of the slurry. The second step is fine polishing. The fine polishing step is performed in a similar manner to the abrasion step. However, a slurry containing less abrasive particles is used. Alternatively, a polishing pad made of a less abrasive material may be used.

The fine polishing step often includes a chemical mechanical polishing ("CMP") process. CMP is the combination of mechanical and chemical abrasion, and may be performed with an acidic or basic slurry. Material is removed from the wafer due to both the mechanical buffing and the action of the acid or base.

The shallow trench isolation (STI) procedure provides an efficient means of producing integrated circuits in the sub- and sub-half micron regime. STI represents a vast improvement over the conventional LOCOS isolation technique. In the STI process, CMP is used to planarize the oxide to expose the nitride stop.

Advantages of the CVD oxide filled STI process include better device isolation, packing density and planarity. STI also eliminates the encroachment and stress problems associated with field oxide growth observed in the LOCOS isolation techniques. A key requirement of the STI process is planarization of CVD oxide to expose the nitride stop while controlling the relative heights of active and field areas. Final height of the field oxide must be higher than that of the active silicon under the nitride stop, but not high enough to produce a substantial step. This requirement poses a severe challenge for the planarization process.

STI planarization using CMP usually requires additional processing steps, thereby increasing the expense. Thus, an inexpensive one step CMP process would be desirable for STI planarization. The CMP process is known to provide excellent local planarity, but global planarity is affected by feature height, size, layout, density and polishing conditions such as mechanical polishing parameters, pad and slurry. An ideal planarization process would remove topography of different geometries simultaneously without dishing in wide low regions. However, current CMP process in STI applications causes dishing and damage to silicon in isolated regions making it unsuitable for production use. Dishing occurs because of longer polish time and pad deflection in the large field areas.

Various methods have been tried to reduce the dishing problem. Boyd and Ellul (J. M. Boyd, et al, Electochem. Soc. Proc., vol. 95-5, 1996, p. 290) reported the use of a thin nitride overcoat (40 nm) deposited on top of the gap filled oxide to reduce dishing. The nitride overcoat provides protection to the underlying oxide in low lying regions while the high level oxide is being polished at a much faster rate due to the oxide selectivity. The CMP process time window can be reduced by using a slurry which has a high oxide removal rate. This slurry should also have a low nitride removal rate in order to achieve local as well as global planarization at the same time. Therefore, a slurry with a high oxide:nitride selectivity is desired for STI applications.

SUMMARY OF THE INVENTION

Provided herein is an alkalinized slurry for shallow trench isolation processing produced by the process of combining a slurry with a base to form an alkalinized slurry, said base provided in an amount sufficient to maintain the pH of the resulting alkalinized slurry in the range of 11 to 13. The slurry may be silica slurry, alumina slurry, or ceria slurry. The base may be sodium hydroxide, potassium hydroxide, or ammonium hydroxide. Preferably, the slurry has a solids content of 8 to 16%, and most preferably 11 to 13%. The alkalinized slurry may also comprise an alkali metal fluoride salt, wherein the alkali is selected from the group consisting of potassium, sodium and lithium. When a fluoride salt is employed, it may be preferable to include an inclusion compound such as crown ether 18.

Also provided herein is an alkalinized slurry having a pH in the range of 11 to 13 which has a selectivity of greater than 10:1. The slurry may be silica slurry, alumina slurry, or ceria slurry. The base may be sodium hydroxide, potassium hydroxide, or ammonium hydroxide. Preferably, the slurry has a solids content of 8 to 16%, and most preferably 11 to 13%. The alkalinized slurry may also comprise an alkali metal fluoride salt, wherein the alkali is selected from the group consisting of potassium, sodium and lithium. When a fluoride salt is employed, it may be preferable to include an inclusion compound such as crown ether 18.

Also provided is a method of enhancing the selectivity in shallow trench polishing, comprising contacting a substrate with an alkalinized slurry having a pH of 11 to 13. The slurry may be silica slurry, alumina slurry, or ceria slurry. The base may be sodium hydroxide, potassium hydroxide, or ammonium hydroxide. Preferably, the slurry has a solids content of 8 to 16%, and most preferably 11 to 13%. The alkalinized slurry may also comprise an alkali metal fluoride salt, wherein the alkali is selected from the group consisting of potassium, sodium and lithium. When a fluoride salt is employed, it may be preferable to include an inclusion compound such as crown ether 18.

Other embodiments and advantages of the invention are set forth, in part, in the description which follows and, in part, will be obvious from this description and may be learned from practice of the invention.

DETAILED DESCRIPTION OF THE INVENTION

Viable STI processing requires a high selectivity for optimal planarization. As used herein, the term "selectivity" refers to the ratio of removal of $SiO_2$ to $Si_3N_4$. Using prior art techniques, the selectivity is most commonly no better than 4:1. By using the techniques described herein, enhanced selectivity ratios of greater than 10:1 and even 15:1 are achieved. The technique involves modification of slurry compositions to achieve the enhanced selectivity.

In one embodiment of the present invention, a nonbuffered slurry with silica abrasive is modified to form an "alkalinized slurry." In alternative embodiments, non-silica based slurries may be used. These include, but are not limited to alumina- and ceria-based slurries.

The alkalanized slurry is made by mixing the slurry with a basic solution to increase the slurry pH to greater than 11, preferably greater than 12, and most preferably greater than 12.5. Hence, the pH range of the alkalinized slurry is 11 to 13, preferably 12 to 13, and most preferably 12.5 to 13. Any suitable basic solution or composition can be used to increase the pH of the slurry. These include, but are not limited to, potassium hydroxide (KOH), sodium hydroxide (NaOH), and ammonium hydroxide ($NH_4OH$). For example, a KOH solution of about 2 to 3 moles/liter can be added to a slurry to achieve the desired pH of the alkalinized slurry. As shown here, the higher the pH, the greater the selectivity. However, at a pH of greater than 13, the oxide etches too fast from the solution, so it is preferable to maintain the pH at 13 or less. A suitable slurry to which the base may be added is Cabot (El Dorado Hills Calif., USA) SC-1, Cabot SC-112, or Rodel ILD1300.

In an alternative embodiment, an alkali metal fluoride salt is contacted with a slurry or with an alkalinized slurry to form a fluorinated slurry or fluorinated alkalanized slurry. The alkali metal fluoride salt is added to the slurry or alkalanized slurry and mixed well, using techniques known to those skilled in the art. This provides fluoride species to the fluorinated slurry or alkalanized fluorinated slurry which provides preferential silicon oxide removal. Fluoride species do not etch silicon nitride.

When the alkali metal fluoride is added to the slurry (not alkalinized as above) the resulting fluoridated slurry has a pH of about 9.5 to about 10.0. The alkali metal fluoride may alternatively be mixed with an alkalinized slurry, formed as described above to bring the pH of the fluoridated alkalinized slurry to 11 or higher, resulting in enhanced selectivity.

The alkali metal is selected from the group consisting of sodium, potassium and lithium. Most preferably, the fluoride salt is sodium fluoride (NaF) or potassium fluoride (KF). Other suitable fluoride salts include ammonium fluoride or ammonium bifluoride.

Excess potassium ion ($K^+$) can neutralize the charged abrasive particles ($SiO_2^-$) in the slurry, causing the slurry to gel. Addition of an inclusion compound such as a crown ether, prevents gelling. Preferably, the crown ether is crown ether 18.

The solids content of the abrasive material in the slurry also has an effect on etch selectivity. Preferably, the solids content is 8–16%, and most preferably 11 to 13%. In the most preferable embodiment, the alkalinized slurry has a solids content of about 12%.

The following example is offered to illustrate embodiments of the invention and should not be viewed as limiting the scope of the invention.

EXAMPLE 1

Effect of pH on Selectivity

The substrates used in this investigation were 150 mm, P<100> wafers with 15,000 Å PETEOS oxide and 2000 Å grown thermal nitride. All substrates were polished using a commercial polishing tool (IPEC, Avanti 472, CM planarizer) with Rodel Q1400, K grooved polyurethane pads.

Commercially available silica and alumina slurries (Cabot) with known solids content and pH were used for polishing. Initially, the silica slurry used was a suspension of 125 nm (mean aggregate particle size) fumed silica particles in aqueous KOH with a pH of 10–10.5. An appropriate amount of KOH (8 moles/liter) was added to increase the pH of the slurry to form the alkalanized slurry. The alumina slurries used for this work were suspensions of 200 nm and 50 nm alumina particles suspended in an aqueous fluorinated ammonium salt (FAS). The fluorinated ammonium salt is known to etch silicon oxide but not the silicon nitride. This modification to the slurry enabled us to investigate the role of chemical action of the slurry. Stability of the slurry was determined by measuring the pH and the size of the particles in the suspension.

The oxide and nitride thicknesses were measured before and after polishing the wafers to determine the oxide:nitride etch selectivity. Two dummy wafers were used to condition the pad. A set of three wafers were used for each oxide and nitride polishing. The polishing parameters used were (unless stated otherwise): slurry flow rate: 150 ml/min, down force: 3 psi, back pressure: 2 psi, platten speed 60 rpm, carrier speed: 30 rpm and polish time: 3 min.

Oxide removal in the chemical-mechanical polishing process is commonly expressed by Preston's Equation:

$$\Delta T/\Delta t = K\rho(P \cdot V)$$

where $\Delta T/\Delta t$ is the removal rate, P is the applied pressure between the wafer and pad, V is the relative velocity of the pad and wafer, and $K\rho$ is the Preston's coefficient. Preston's coefficient ($K\rho$) is a function of the film properties and chemical components in the polishing process. If polishing parameters are kept constant, that is, $P \cdot V$=constant, the removal rate is proportional to Preston's coefficient ($K\rho$) which represents the chemical component of the slurry. Thus, by increasing the chemical component of the slurry, the silicon oxide removal rate can be increased and therefore, oxide:nitride selectivity can be increased provided that the increased chemical component does not increase the nitride removal rate.

Polishing results with a silica slurry containing 12 weight % solids content and varying pH are shown in Table 1. The pH of the slurry was adjusted by adding hydroxide (—OH) ions to the commercially available silica slurry. Table 1 clearly indicates that the oxide:nitride etch selectivity increases with increased pH of the slurry. Our experiments reveal that the oxide removal rate increases as the pH of the slurry increases, while the removal rate of nitride decreases.

This is a desirable result for STI applications where it is required that nitride not be polished once the nitride stop is exposed.

TABLE 1

Effect of pH on Selectivity (12% solids)

| pH | Selectivity |
|---|---|
| 10.0 | 4.0 |
| 10.5 | 4.2 |
| 11.0 | 4.5 |
| 11.5 | 5.0 |
| 12.0 | 7.0 |
| 12.5 | 10.0 |
| 13.0 | 14.5 |

Inspection of the wafers polished using a silica slurry with a high pH (eg., pH 13) showed pitting on the wafer surfaces. Also the study of the slurry characteristics indicate that the pH of the slurry decreases over time and as a result the selectivity decreases. However, high oxide removal rate at high pH of the slurry makes the polish time process window short. Thus this slurry can be used if pitting is not a concern and Point of Use (POU) mixing of the chemicals is performed.

The polishing results of the experiment with a silica slurry containing 2 weight % solids content and varying pH are shown in Table 2. These results are similar to the results for higher solid contents (12 weight %) except that the oxide removal rate is much lower. Table 2 reveals that the oxide:nitride etch selectivity increases with the pH of the slurry. The removal rates of oxide and nitride are shown in Table 3. Table 3 shows that by increasing the chemical action the removal rate of oxide increases and the removal rate of nitride decreases, and as a result increases the oxide:nitride selectivity.

TABLE 2

Effect of pH on Selectivity (2% Solids)

| pH | Selectivity |
|---|---|
| 11.0 | 0.5 |
| 11.5 | 5.0 |
| 12.0 | 7.0 |
| 12.5 | 9.0 |

TABLE 3

Oxide and Nitride Removal Rates (R/R)

| pH | solid (weight %) | oxide RR (Å/min) | nitride RR (Å/min) | selectivity |
|---|---|---|---|---|
| 10.3 | 12 | 1400 | 340 | 4.1:1 |
| 10.3 | 2 | 20 | 24 | 1:1 |
| 12.5 | 12 | 2400 | 240 | 10:1 |
| 12.5 | 2 | 152 | 16 | 9.5:1 |

A comparison of the results for 12 weight % and 2 weight % solids content at the same pH in both cases indicates that the removal rate is a function of solids content in the slurry. The oxide removal rate for a slurry with 12% solids content at pH 10.3 is 1400 Å/min while for a slurry with 2% solids content the oxide removal rate is about 20 Å/min. Thus, the more the solids content in the slurry, the higher the oxide removal rate. However, increased pH enhances the oxide removal rate and decreases the nitride removal rate. This results in a higher etch selectivity. The oxide removal rate with a slurry containing 12% solids content at a pH of 12.5 is about 2400 Å/min while for 2% solids content at the same pH, the oxide removal rate is 152 Å/min, although the etch selectivity of the two slurries is almost same. Thus to obtain a small process time window and high etch selectivity, both chemical as well as mechanical actions are required.

Reduction in nitride removal rate at a high pH can be explained by proposing the "electrical double layer (EDL)" theory (Yoshihiro Hayashi et al, Jpn. J. Appl., Phys. Vol. 34, 1995, p. 1037). The dependence of EDL on pH and its effect on mechanical action of a slurry has been reported by (J. M. Boyd et al, Electochem. Soc. Proc., vol. 95-5, p. 290, 1996). According to this theory, agglomeration of slurry particles is described by the width of the EDL. EDL width is small at low pH implying that the slurry particles are agglomerated while the EDL width increases at higher pH thus disperses the particles and reduces the size of the effective agglomerated particles. Thus, at high pH particles are dispersed and the effective size is small thereby reducing the mechanical action and therefore slowing down the nitride removal rate. Oxide removal rate is also slowed down but is compensated for by the chemical action.

Although the present invention has been described in detail, it should be understood that various changes, alterations and substitutions may be made to the teachings herein without departing from the spirit and scope of the present invention, which is defined solely by the appended claims.

What is claimed is:

1. An alkalinized slurry for shallow trench isolation processing produced by the process of combining a slurry with a base to form an alkalinized slurry, said base provided in an amount sufficient to maintain the pH of the resulting alkalinized slurry in the range of 11 to 13;

and wherein said slurry has a solids content of 11 to 13%.

2. An alkalinized slurry for shallow trench isolation processing produced by the process of combining a slurry with a base to form an alkalinized slurry, said base provided in an amount sufficient to maintain the pH of the resulting alkalinized slurry in the range of 11 to 13, said alkalinized slurry further comprising an alkali metal fluoride salt.

3. The alkalinized slurry of claim 2, wherein said alkalinized slurry has a pH of 12 to 13.

4. The alkalinized slurry of claim 2, wherein said alkalinized slurry has a pH of 12.5 to 13.

5. The alkalinized slurry of claim 2, wherein said slurry is selected from the group consisting of silica slurry, alumina slurry, and ceria slurry.

6. The alkalinized slurry of claim 2, wherein said base is selected from the group consisting of sodium hydroxide, potassium hydroxide and ammonium hydroxide.

7. The alkalinized slurry of claim 2, wherein said alkali metal is selected from the group consisting of potassium, sodium and lithium.

8. The alkalinized slurry of claim 2, wherein said alkali metal fluoride salt is potassium fluoride.

9. An alkalinized slurry for shallow trench isolation processing produced by the process of combining a slurry with a base to form an alkalinized slurry, said base provided in an amount sufficient to maintain the pH of the resulting alkalinized slurry in the range of 11 to 13, said alkalinized slurry further comprising a salt selected from the group consisting of ammonium fluoride and ammonium bifluoride.

10. The alkalinized slurry of claim 2, further comprising an inclusion compound.

11. The alkalinized slurry of claim 10, wherein said inclusion compound is a crown ether.

12. The alkalinized slurry of claim 11, wherein said crown ether is crown ether 18.

13. An alkalinized slurry having a pH in the range of 11 to 13 which has a selectivity of greater than 10:1; and wherein said slurry has a solids content of 11 to 13%.

14. An alkalinized slurry having a pH in the range of 11 to 13 which has a selectivity of greater than 10:1; said alkalinized slurry comprising an alkali metal fluoride salt.

15. The alkalinized slurry of claim 14, wherein said slurry is selected from the group consisting of silica slurry, alumina slurry, and ceria slurry.

16. The alkalinized slurry of claim 14, wherein said slurry has a pH of 12 to 13.

17. The alkalinized slurry of claim 14, wherein said slurry has a pH of 12.5 to 13.

18. The alkalinized slurry of claim 14, wherein said slurry has a solids content of 8 to 16%.

19. The alkalinized slurry of claim 14, wherein said alkali metal is selected from the group consisting of potassium, sodium and lithium.

20. The alkalinized slurry of claim 14, wherein said alkali metal fluoride salt is potassium fluoride.

21. An alkalinized slurry having a pH in the range of 11 to 13 which has a selectivity of greater than 10:1; said alkalinized slurry comprising a salt selected from the group consisting of ammonium fluoride and ammonium bifluoride.

22. The alkalinized slurry of claim 14, further comprising an inclusion compound.

23. The alkalinized slurry of claim 22, wherein said inclusion compound is a crown ether.

24. The alkalinized slurry of claim 23, wherein said crown ether is crown ether 18.

25. A method of enhancing the selectivity in shallow trench polishing, comprising contacting a substrate with an alkalinized slurry having a pH of 11 to 13; and wherein said alkalinized slurry further comprises an alkali metal fluoride salt.

26. The method according to claim 25, wherein said alkalinized slurry has a pH of 12 to 13.

27. The method according to claim 25, wherein said alkalinized slurry has a pH of 12.5 to 13.

28. The method according to claim 25, wherein said alkalinized slurry has a solids content of 8 to 16%.

29. A method of enhancing the selectivity in shallow trench polishing, comprising contacting a substrate with an alkalinized slurry having a pH of 11 to 13; and wherein said alkalinized slurry has a solids content of 11 to 13%.

30. The method according to claim 25 wherein said alkali metal is selected from the group consisting of potassium, solidum and lithium.

31. The method according to claim 25 wherein said alkali metal fluoride salt is potassium fluoride.

32. A method of enhancing the selectivity in shallow trench polishing, comprising contacting a substrate with an alkalinized slurry having a pH of 11 to 13; and wherein said alkalinized slurry further includes a salt selected from the group consisting of ammonium fluoride and ammonium bifluoride.

33. The method according to claim 25 wherein said alkalinized slurry further comprises an inclusion compound.

34. The method according to claim 33 wherein said inclusion compound is a crown ether.

35. The method according to claim 34 wherein said crown ether is crown ether 18.

36. An alkalinized slurry according to claim 2 which has a selectivity of greater than 10:1 with respect to removal of a silicon oxide structure versus a silicon nitride structure.

* * * * *